United States Patent
Phelps et al.

(10) Patent No.: US 9,755,015 B1
(45) Date of Patent: Sep. 5, 2017

(54) AIR GAPS FORMED BY POROUS SILICON REMOVAL

(71) Applicant: GLOBALFOUNDRIES INC., Grand Cayman (KY)

(72) Inventors: Richard A. Phelps, Colchester, VT (US); James A. Slinkman, Montpelier, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/150,977

(22) Filed: May 10, 2016

(51) Int. Cl.
*H01L 21/70* (2006.01)
*H01L 29/06* (2006.01)
*H01L 21/764* (2006.01)

(52) U.S. Cl.
CPC ........ *H01L 29/0649* (2013.01); *H01L 21/764* (2013.01)

(58) Field of Classification Search
CPC ............... H01L 21/1203; H01L 21/765; H01L 21/823878; H01L 21/762; H01L 29/4991; H01L 29/0649; H01L 21/764
See application file for complete search history.

(56) References Cited

U.S. PATENT DOCUMENTS

| | | |
|---|---|---|
| 5,250,460 A | 10/1993 | Yamagata et al. |
| 5,466,631 A | 11/1995 | Ichikawa et al. |
| 5,670,411 A | 9/1997 | Yonehara et al. |
| 6,140,209 A | 10/2000 | Iwane et al. |
| 6,143,628 A | 11/2000 | Sato et al. |
| 6,180,497 B1 | 1/2001 | Sato et al. |
| 6,190,937 B1 | 2/2001 | Nakagawa et al. |
| 6,326,279 B1 | 12/2001 | Kakizaki et al. |
| 2007/0246752 A1* | 10/2007 | Cheng .............. H01L 29/66545 257/288 |
| 2007/0275537 A1* | 11/2007 | Henson ................. H01L 21/764 438/421 |
| 2016/0071925 A1* | 3/2016 | Jaffe .................... H01L 29/0649 257/347 |

OTHER PUBLICATIONS

Cutting Edge 2; Eltran; Novel SOI Wafer Technology, Takao Yonehara and Kiyofumi Sakaguchi, (Jul. 2001).

* cited by examiner

*Primary Examiner* — Khiem D Nguyen
(74) *Attorney, Agent, or Firm* — Thompson Hine LLP; Anthony Canale

(57) ABSTRACT

Semiconductor structures formed using a substrate that has a porous semiconductor layer and a device layer on the porous semiconductor layer. One or more trench isolation regions are formed in the device layer that surround an active device region. An opening is formed that extends through the one or more trench isolation regions to the porous semiconductor layer. A removal agent is directed through the opening to remove the porous semiconductor layer from a volume beneath the active device region and thereby form an air gap vertically beneath the active device region.

11 Claims, 2 Drawing Sheets

US 9,755,015 B1

AIR GAPS FORMED BY POROUS SILICON REMOVAL

BACKGROUND

The invention relates generally to semiconductor devices and integrated circuit fabrication and, in particular, to semiconductor structures for an active device region and methods of forming such semiconductor structures.

Devices fabricated using semiconductor-on-insulator (SOI) technologies may exhibit certain performance improvements in comparison with comparable devices built directly in a bulk silicon substrate. Generally, an SOI wafer includes a thin device layer of semiconductor material, a handle substrate, and a thin buried insulator layer, such as a buried oxide or BOX layer, physically separating and electrically isolating the device layer from the handle substrate. Integrated circuits are fabricated using the semiconductor material of the device layer. A primary source of the improved performance is due to the presence of the BOX layer.

Improved semiconductor structures for an active device region and methods of forming such semiconductor structures are needed.

SUMMARY

In an embodiment of the invention, a method is provided for forming a semiconductor structure using a substrate that has a porous semiconductor layer and a device layer on the porous semiconductor layer. One or more trench isolation regions are formed in the device layer that surround an active device region. An opening is formed that extends through the one or more trench isolation regions to the porous semiconductor layer. A removal agent is directed through the opening to remove the porous semiconductor layer from a volume beneath the active device region and thereby form an air gap vertically beneath the active device region such that the active device layer is supported.

In an embodiment of the invention, a device structure is formed using a substrate that has a porous semiconductor layer and a device layer on the porous semiconductor layer. The semiconductor structure includes one or more trench isolation regions in the device layer and an air gap in the porous semiconductor layer. The one or more trench isolation regions surround an active device region. The air gap is vertically located beneath the active device region and laterally located between a first section of the porous semiconductor layer and a second section of the porous semiconductor layer. The first section of the porous semiconductor layer and the second section of the porous semiconductor layer are located beneath the active device region such that the active device layer is supported.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
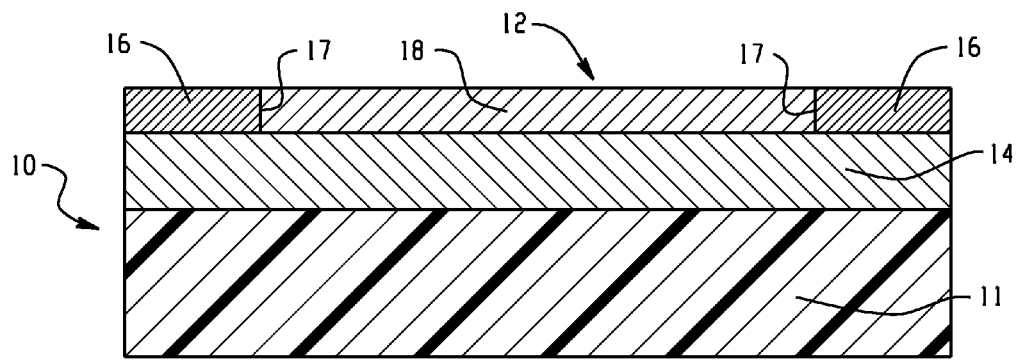
FIGS. 1-4 are cross-sectional views of a portion of a substrate at successive stages of a processing method for fabricating a structure for a device region in accordance with an embodiment of the invention.

With reference to FIG. 1 and in accordance with an embodiment of the invention, a substrate 10 comprises a single-crystal semiconductor material, such as silicon, usable to form the devices of an integrated circuit. Substrate 10 may be, for example, a bulk silicon wafer or an active silicon SOI layer of a silicon-on-insulator wafer. At its top surface, the substrate 10 may include a device layer 12, which may contain an amount of an electrically-active dopant that enhances its electrical properties relative to the remainder of the substrate 10.

The substrate 10 further includes a porous semiconductor layer 14 that is located beneath the device layer 12 at the top surface of the substrate 10 and a handle wafer 11. In an embodiment of the invention, the porous semiconductor layer 14 may be formed by converting the semiconductor material (e.g. silicon) of a seed wafer to a porous semiconductor material (e.g., porous silicon) using an anodization process performed using an aqueous electrolyte or anodization solution containing hydrofluoric acid (HF), such as a solution of hydrofluoric acid and a monohydric alcohol like ethanol. The seed wafer is contacted with a biased electrode and immersed, along with a separate oppositely-biased electrode, into a bath of the anodization solution. An electrical current is passed through the electrodes and the seed wafer for an anodization time sufficient to convert the heavily doped silicon to porous silicon and complete the process forming the porous semiconductor layer 14. The anodization process creates pores across the depth of the porous semiconductor layer 14 in which the resulting porosity may be proportional to factors such as current density. For example, the porous semiconductor layer 14 may include sub-layers of differing porosity may be formed by changing the current density during anodization to two different values. The surface of the porous semiconductor layer 14 may be smoothed and the pores at its surface sealed by, for example, a combination of a wet etch using a solution containing hydrofluoric acid and hydrogen peroxide ($H_2O_2$) and a subsequent thermal anneal in a hydrogen-rich atmosphere. The device layer 12 may then be formed on the sealed and smoothed surface by, for example, an epitaxial deposition process involving chemical vapor deposition (CVD). The device layer 12 and porous semiconductor layer 14 may then be transferred to the substrate 10 by a transfer process.

Trench isolation regions 16 are located in the semiconductor material of the substrate 10. An active device region 18 used in fabricating a device structure is bounded by the trench isolation regions 16. The active device region 18 is comprised of a portion of the semiconductor material of the device layer 12, and has an outer boundary 17 established in part by location of the trench isolation regions 16. The trench isolation regions 16 extend from the top surface of the device layer 12 to a shallow depth beneath the top surface. The trench isolation regions 16 may be formed by forming an etch mask using photolithography and etching to define trenches, followed by filling the trenches with a dielectric material, such as silicon dioxide ($SiO_2$) deposited by chemical vapor phase deposition and subsequently planarized.

Figure 2:
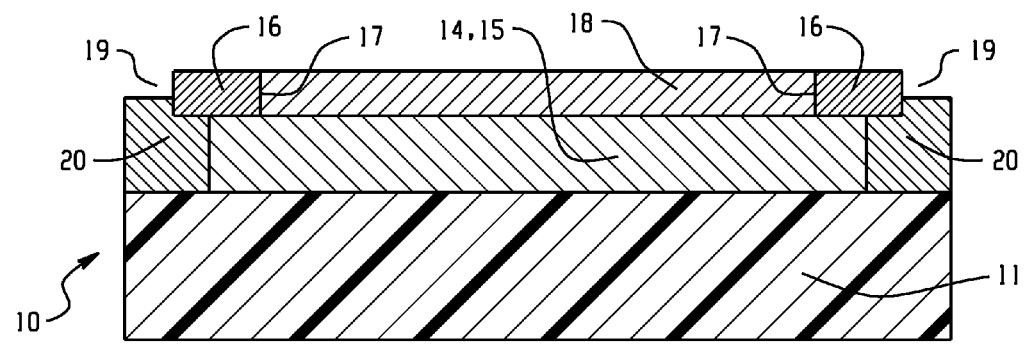

With reference to FIG. 2 in which like reference numerals refer to like features in FIG. 1 and at a subsequent fabrication stage of the processing method, the trench isolation regions 16 are etched and partially removed in the presence of a mask to form an openings 19 that extend completely through the trench isolation regions 16 to the underlying porous semiconductor layer 14. The etchant used to remove the portions of the trench isolation regions 16 to form the openings 19 may be a buffered hydrofluoric acid (BHF) solution, which removes silicon dioxide selective to (i.e., at a higher etch rate than) silicon. Other portions of the trench isolation regions 16 located laterally between the openings 19 and the active device region 18 are protected and preserved due to the presence of the mask.

Oxidized regions 20 are formed in the semiconductor material of the porous semiconductor layer 14. The oxidized regions 20 may be formed using a wet or dry thermal oxidation process and with the same mask used to form the openings 19 present. The oxidation agent used to form the oxidized regions 20 is directed through the openings 19 to the porous semiconductor layer 14. Due to its porosity, the porous semiconductor layer 14 may more readily oxidize than the semiconductor material of the substrate 10 underlying the oxidized regions 20, which may serve to confine the depth of oxidation to the thickness of the porous semiconductor layer 14. The oxidation may proceed laterally beneath the trench isolation regions 16 such that portions of the oxidized regions 20 are located beneath the trench isolation regions 16. The oxidized regions 20 laterally bound a section 15 of the porous semiconductor layer 14.

Figure 3:
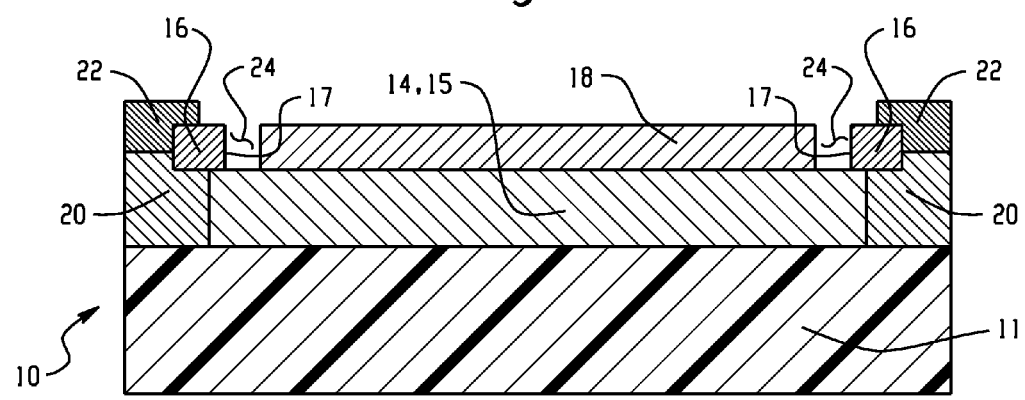

With reference to FIG. 3 in which like reference numerals refer to like features in FIG. 2 and at a subsequent fabrication stage of the processing method, a layer 22 is deposited and patterned. The layer 22 is comprised of a material that etches selective to (i.e., at a higher etch rate than) the materials of the trench isolation regions 16 and the active device region 18. The layer 22 covers the oxidized regions 20 and overlaps with a portion of the trench isolation regions 16 adjacent to the oxidized regions 20. A mask present during deposition defines the locations at which the layer 22 is present and absent. The mask may be the same mask used during the prior etching process partially removing the trench isolation regions 16. The layer 22 may be comprised of a dielectric layer, such as silicon nitride ($Si_3N_4$), deposited by chemical vapor deposition and etched by an etching process, such as reactive ion etching.

The trench isolation regions 16 are etched and partially removed over areas not covered by the layer 22. The etchant, which removes the material of the trench isolation regions 16 selective to the material of the active device region 18, may be a buffered hydrofluoric acid (BHF) solution. Portions of the trench isolation regions 16 adjacent to and bordering the active device region 18 are removed by the etch to trenches defining openings 24 extending through the trench isolation regions 16 to the section 15 of the porous semiconductor layer 14. Other portions of the trench isolation regions 16 laterally separated from the active device region 18 by the openings 24 are protected and preserved due to the presence of the layer 22.

The oxidized regions 20 are protected during etching and preserved due to the presence of the layer 22, and the semiconductor material of the active device region 18 is unaffected by the etching process. The outer boundary 17 of the active device region 18 is located adjacent to the openings 24 following the partial removal of the trench isolation regions 16. The openings 24 are located laterally between the residual portions of the trench isolation regions 16 and the active device region 18.

Figure 4:
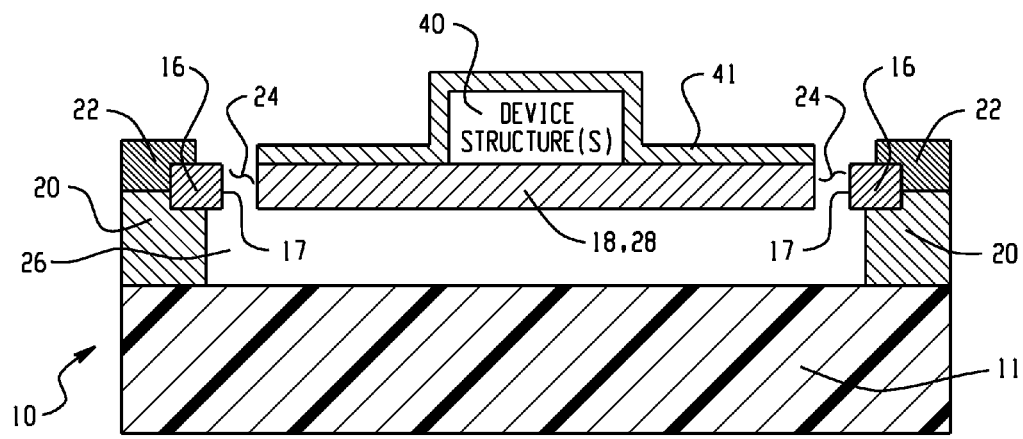
Figure 5:
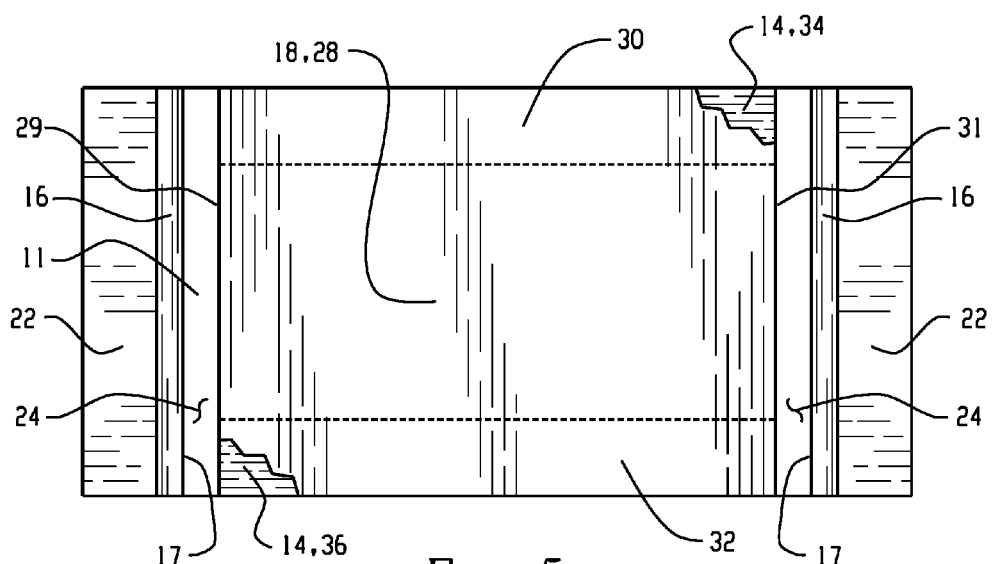
FIG. 5 is a top view of the structure of FIG. 4 in which the device structures and protective layer are omitted for purposes of clarity of description.

With reference to FIGS. 4, 5 in which like reference numerals refer to like features in FIG. 3 and at a subsequent fabrication stage of the processing method, one or more device structures 40, such as one or more field effect transistors, are formed using the active device region 18 during front-end-of-line (FEOL) processing. The device structure(s) 40 and active device region 18 are covered by a protective barrier layer 41, such as by a layer of silicon nitride deposited by chemical vapor deposition, to prevent modification of the device structure(s) 40 and active device region 18 when subsequently forming the air gap 26.

The section 15 of the porous semiconductor layer 14 is removed to form an air gap 26. The section 15 of the porous semiconductor layer 14 functions as a temporary, sacrificial material that occupies the space opened at this juncture of the processing method to define the air gap 26. The air gap 26 may have nominally the same volume as the section 15 of the porous semiconductor layer 14 that is removed. The oxidized regions 20 limit the space over which the section 15 of the porous semiconductor layer 14 is removed, and laterally bound the air gap 26 after the section 15 is removed.

The section 15 of the porous semiconductor layer 14 may be removed using a removal agent, such as etchant solution (e.g., dilute potassium hydroxide (1% KOH in water)), that is directed through the openings 24. The removal agent interacts with the section 15 of the porous semiconductor layer 14 and causes its removal outward through the openings 24. In the representative embodiments, the etchant solution may be heated and/or supplied under high pressure, such as being forced through the openings 24 under a pressure of 2 to 3 atmospheres. In an embodiment, the process removing the section 15 of the porous semiconductor layer 14 does not rely on an acid as an etchant. The oxidized regions 20 are unaffected by the process removing the section 15 of the porous semiconductor layer 14, and are intact following its removal.

The air gap 26 is vertically located beneath the active device region 18 between the handle wafer 11 and the active device region 18. More specifically, the air gap 26 is vertically located beneath a beam or bridge 28 of the active device region 18, as diagrammatically illustrated by the dashed lines in FIG. 5. The openings 24 are laterally located between the side edges 29, 31 of the bridge 28 and respective trench isolation regions 16 such that the bridge 28 is not connected or supported at its side edges 29, 31. The porous semiconductor layer 14 is not removed from underneath sections 30, 32 of the active device region 18. The bridge 28 extends laterally from one end integrally attached to the section 30 of the active device region 18 to an opposite end integrally attached to the section 32 of the active device region 18. The sections 30, 32 of the active device region 18 directly support the bridge 28.

The porous semiconductor material in the sections 34, 36 of the porous semiconductor layer 14 is neither oxidized nor removed, and these sections 34, 36 are respectively located beneath the sections 30, 32 of the active device region 18. The bridge 28 is also laterally located between these sections 34, 36 of the porous semiconductor layer 14. The removal process is controlled (e.g., timed) such that these sections 34, 36 of the porous semiconductor layer 14 are not removed when the sacrificial section 15 is removed. These sections 34, 36 of the porous semiconductor layer 14 directly support the sections 30, 32 of the active device region 18 and thereby indirectly support the bridge 28.

The air gap 26 may be characterized by an effective permittivity or dielectric constant of near unity (vacuum permittivity), or may be filled by air at or near atmospheric pressure, may be filled by another gas at or near atmospheric pressure, or may contain air or another gas at a sub-atmospheric pressure (e.g., a partial vacuum). The "silicon on nothing" architecture provides efficient electrical isolation for the one or more device structures 40.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure formed using a substrate that has a porous semiconductor layer and a device layer on the porous semiconductor layer, the semiconductor structure comprising:
    a first trench isolation region and a second trench isolation region in the device layer;
    an active device region including a bridge located laterally between the first trench isolation region and the second trench isolation region, the bridge having a first side edge adjacent to the first trench isolation region;
    an air gap in the porous semiconductor layer, the air gap vertically located beneath the bridge and laterally located between a first section of the porous semiconductor layer and a second section of the porous semiconductor layer; and
    a first opening in the device layer laterally located directly between the first side edge of the bridge and the first trench isolation region such that the bridge is not supported at the first side edge, the first opening providing an open path communicating with the air gap,
    wherein the first section of the porous semiconductor layer and the second section of the porous semiconductor layer are located beneath the active device region and support the active device region.

2. The semiconductor structure of claim 1 wherein the bridge has a second side edge adjacent to the second trench isolation region, and further comprising:
    a second opening in the device layer laterally located directly between the second side edge of the bridge and the second trench isolation region such that the bridge is not supported at the second side edge, the second opening providing a second open path communicating with the air gap,
    wherein the second opening is aligned parallel to the first opening along respective long axes.

3. The semiconductor structure of claim 2 wherein the first section of the porous semiconductor layer and the second section of the porous semiconductor layer are laterally located between the first opening and the second opening.

4. The semiconductor structure of claim 2 wherein the porous semiconductor layer further includes a third section and a fourth section each comprised of oxidized porous semiconductor, the third section is aligned parallel with the first trench isolation region, and the fourth section is aligned parallel with the second trench isolation region.

5. The semiconductor structure of claim 4 wherein the air gap is laterally located between the third section and the fourth section.

6. The semiconductor structure of claim 1 wherein the porous semiconductor layer further includes a third section comprised of oxidized porous semiconductor, the third section is laterally located adjacent to the air gap, and the third section extends in a direction from the first section of the porous semiconductor layer to the second section of the porous semiconductor layer.

7. The semiconductor structure of claim 6 wherein a portion of the third section of the porous semiconductor layer extends laterally beneath the one or more trench isolation regions.

8. The semiconductor structure of claim 1 further comprising:
    a device structure formed using the active device region.

9. The semiconductor structure of claim 1 wherein the substrate further includes a handle wafer, the porous semiconductor layer is vertically located between the device layer and the handle wafer, and the air gap is vertically located between the active device region and the handle wafer.

10. The semiconductor structure of claim 1 wherein the porous semiconductor layer further includes a third section and a fourth section each comprised of oxidized porous semiconductor, and the air gap is laterally located between the third section and the fourth section.

11. The semiconductor structure of claim 1 wherein the bridge is supported at opposite ends by the first section of the porous semiconductor layer and the second section of the porous semiconductor layer.

* * * * *